US007748993B2

(12) United States Patent
Midorikawa et al.

(10) Patent No.: US 7,748,993 B2
(45) Date of Patent: Jul. 6, 2010

(54) ELECTRICAL CONNECTOR WITH REGULATING PORTION FOR REGULATING ELASTIC DEFORMATION OF TERMINAL

(75) Inventors: Kazuya Midorikawa, Tokyo (JP); Tetsuya Ooi, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 12/379,658

(22) Filed: Feb. 26, 2009

(65) Prior Publication Data

US 2009/0221157 A1 Sep. 3, 2009

(30) Foreign Application Priority Data

Feb. 29, 2008 (JP) ............................ 2008-050123

(51) Int. Cl.
*H01R 12/00* (2006.01)
*H05K 1/00* (2006.01)

(52) U.S. Cl. ........................................................ 439/74

(58) Field of Classification Search .................. 439/74, 439/660, 295
See application file for complete search history.

(56) References Cited

U.S. PATENT DOCUMENTS 5,695,353 A * 12/1997 Sakata et al. ................ 439/326
7,354,279 B2 * 4/2008 Uesaka ........................ 439/74
7,367,816 B2 * 5/2008 Liu ............................. 439/74
7,410,364 B2 * 8/2008 Kishi et al. ................... 439/74
7,465,171 B2 * 12/2008 Miyazaki et al. ............. 439/74
7,568,919 B2 * 8/2009 Hoshino et al. ............... 439/74
2006/0178022 A1 * 8/2006 Liu ............................. 439/74
2007/0141866 A1 * 6/2007 Kishi et al. ................... 439/74
2008/0299796 A1 * 12/2008 Hoshino et al. ............... 439/72

FOREIGN PATENT DOCUMENTS

JP 2007-134091 5/2007
JP 2007-305513 11/2007

OTHER PUBLICATIONS

Office Action of Japan Patent Office, Feb. 22, 2010.

* cited by examiner

*Primary Examiner*—Hae Moon Hyeon
(74) *Attorney, Agent, or Firm*—Kubotera & Associates LLC

(57) ABSTRACT

A connector to be connected to a mating connector includes a housing having a receptacle recess portion for receiving the mating connector, and a terminal retained in the housing. The housing includes a containing groove extending in a connecting direction for containing a fitting portion of the terminal. The fitting portion of the terminal includes an engaging portion at a side end edge thereof. The containing groove includes a regulating wall portion extending in the connecting direction and located inner side than a position of an edge surface of the engaging portion at the containing groove. The regulating wall portion includes a regulating surface extending in the connecting direction and a width direction of the terminal. When the mating connector is extracted, the regulating surface regulates an elastic deformation of the fitting portion by abutting against and engaging with the engaging portion.

8 Claims, 9 Drawing Sheets

ELECTRICAL CONNECTOR WITH REGULATING PORTION FOR REGULATING ELASTIC DEFORMATION OF TERMINAL

CROSS-REFERENCES TO RELATED APPLICATIONS

The disclosure of Japanese Patent Application No. 2008-050123, filed on Feb. 29, 2008 is incorporated in the application by reference.

BACKGROUND OF THE INVENTION AND RELATED ART STATEMENT

The present invention relates to an electrical connector. More specifically, the present invention relates to an electrical connector having a terminal formed of a metal plate bent in a thickness direction thereof and capable of elastic deformation in the thickness direction. In the electrical connector, the terminal is held with a terminal holding wall of a housing.

A conventional electrical connector (a connector) includes a terminal mounted into a terminal holding wall from a side that the connector receives a mating connector. When the connector is connected to the mating connector, the terminal contacts a mating terminal of the mating connector. Further, the terminal deforms elastically pressed by the mating terminal. Thus, with a contact pressure, the terminal maintains a connecting state thereof with respect to the mating terminal. When the mating connector is disconnected, a frictional resistance is generated at a contacting portion of the terminal and the mating terminal. As a result, the terminal may come off from the terminal holding wall by a force toward an extracting direction of the mating connector generated by the frictional resistance.

Patent Reference has disclosed a conventional electrical connector. The conventional electrical connector (connector) disclosed in Patent Reference includes engaging surfaces on both of a terminal and a housing thereof at respective step portions. When a mating connector is extracted, a pair of the engaging surfaces contacts to each other in a connecting direction of the connector and the mating connector (connectors) and regulates a deformation of the terminal toward the connecting direction of the connectors, so that the terminal can be prevented from coming off.

Patent Reference: Japanese Patent Publication No. 2007-134091

In the conventional electrical connector, the housing with a rectangular solid shape includes a receptacle recess portion formed by a circumferential wall of the housing for receiving the mating connector. Further, a plurality of holding grooves for holding the terminals is formed in a sidewall with a regular interval therebetween in a longitudinal direction of the housing.

The terminal is formed of a metal plate having a belt shape and bent in a thickness direction thereof to form a laterally facing S-shape. The terminal includes a contact arm portion at one free end thereof. The contact arm portion includes a contact portion for contacting with the mating terminal, and is capable of elastic deformation. The terminal further includes a held portion at the other free end thereof held by the housing.

The terminal is inserted into the holding groove from a forefront of the held portion first in a receiving direction of the mating connector, while maintaining the laterally facing S-shape. The terminal is held by an inner surface of the holding groove. The contact arm portion held into the holding groove extends in an upward direction, and the contact portion thereof protrudes toward the receptacle recess portion from the holding groove.

The contact arm portion of the terminal includes an engaging protrusion at a portion thereof held in the holding groove, and the engaging protrusion protrudes in a width direction of the terminal. An upper surface or an engaging surface of the engaging protrusion extends in a direction perpendicular to the connecting direction of the connectors. An area of the engaging surface is determined by a size of the engaging protrusion in the width direction and the thickness direction of the terminal.

Corresponding to the engaging protrusion, the housing includes a regulating step portion in the inner surface of the holding groove. The regulating step portion protrudes from the inner surface of the holding groove, and is situated at a position at an upper side of the engaging protrusion and an inner side of the holding groove. The regulating step portion includes a lower surface extending perpendicular to the connecting direction of the connectors for contacting and engaging with the upper surface of the engaging protrusion when the mating connector is extracted.

When the connector is connected to the mating connector, the contact arm portion of the terminal deforms elastically toward the holding groove due to a contact pressure from the contact portions of the connector and the mating connector. Accordingly, a portion of the upper surface of the engaging protrusion is situated at a position facing the lower surface of the regulating step portion, that is, right under the regulating step portion.

When the mating connector is extracted, the terminal deforms in the upward direction by an upward force in the extracting direction of the mating connector due to a frictional resistance between the respective contact portions of the terminal and the mating terminal. As the terminal deforms upward, the upper surface of the engaging protrusion engages with the lower surface of the regulating step portion. As a result, the upper surface of the engaging protrusion contacts and engages with the lower surface of the regulating step portion.

In the connector disclosed in Patent Reference, as described above, the engaging protrusion of the terminal engages with the regulating step portion of the housing in the extracting direction of the mating connector, thereby regulating an excessive deformation of the terminal and preventing the terminal from coming off.

In the conventional connector described above, the upper surface of the engaging protrusion engages with the regulating step portion of the housing when the mating connector is extracted. The upper surface can have as little size as the thickness of the engaging protrusion at a maximum in the thickness direction of the terminal, though the size is decisive for the area thereof. As a result, when a manufacturing error or an assembling error occurs, the engaging protrusion may not reach the position right under the regulating step portion when the terminal deforms elastically as the connector is connected to the mating connector. In this case, the terminal may come off due to a failure to engage the engaging protrusion with the regulating step portion in the connecting direction of the connectors.

Further, as described above, the lower surface of the regulating step portion engaging with the upper surface of the engaging protrusion is perpendicular to the connecting direction of the connectors. In order to form the lower surface, it is necessary to open a hole penetrating a bottom wall portion of the housing for removing a mold from a bottom of the housing after the housing is shaped. As a result, the bottom wall portion may not obtain a sufficient strength. Furthermore, when the connector is mounted on a circuit board, an electrical conduction therebetween may occur due to a narrow space. Consequently, an electric property may be deteriorated.

In view of the problems described above, an object of the present invention is to provide a connector capable of securely preventing a terminal from coming off as a mating connector is extracted, and not including a hole at a bottom wall portion thereof.

Further objects and advantages of the invention will be apparent from the following description of the invention.

SUMMARY OF THE INVENTION

In order to attain the objects described above, according to the present invention, an electrical connector (connector) includes a terminal formed of a metal plate bent in a width direction thereof; and a housing including a terminal holding wall for holding the terminal. The terminal includes a fitting portion capable of an elastic deformation in a thickness direction thereof and having an approximate U-shape opening toward a connecting direction for connecting the mating connector; and a held portion held by the terminal holding wall and combined the fitting portion.

In the electrical connector in the present invention, the fitting portion of the terminal includes an engaging portion on a side edge thereof. The housing includes a containing groove extending in the connecting direction for containing a portion of the fitting portion. The containing groove includes a regulating wall portion extending in the connecting direction. Further, a portion of an inner surface of the regulating wall portion is located an inner side of the containing groove relative to an edge of the engaging portion. The regulating wall portion includes a regulating surface extending in the connecting direction of the connectors and a width direction of the terminal. The regulating surface regulates an elastic deformation of the fitting portion by abutting against the engaging portion of the fitting portion and engaging therewith when the mating connector is extracted from the electrical connector.

In the electrical connector described above, the fitting portion receives a frictional resistance with respect to a mating terminal and deforms elastically around a portion of the terminal as a pivot when the mating connector is extracted. The regulating surface of the regulating wall portion abuts against and engages with the engaging portion with one of surfaces thereof extending in the connecting direction of the connectors and the width direction of the terminal in a direction perpendicular to the regulating surface. The elastic deformation of the fitting portion is regulated by engagement of the regulating surface and the surface of the engaging portion. As a result, the elastic deformation of the fitting portion is continuously regulated while the mating connector is extracted.

In the electrical connector described above, the held portion may extend along the terminal holding wall in the connecting direction of the connectors. The held portion may be combined with the fitting portion at a position near the terminal holding wall facing a fitting area. The fitting portion may deform elastically around a combining area of the held portion and the fitting portion as a pivot.

Further, the held portion may extend along the terminal holding wall in the connecting direction of the connectors. The fitting portion may deform elastically around the held portion at a farther side from the fitting portion thereof as a pivot.

It is preferred that the engaging portion is formed on at least one of a portion of the fitting portion on a side of the terminal holding wall relative to the regulating surface and another portion of the fitting portion on an opposite side of the terminal holding wall relative to the regulating surface. In the connector having the engaging portion at least one of the portions as described above, when the fitting portion deforms elastically, the engaging portion formed on the side of the terminal holding wall relative to the regulating surface engages with the regulating surface from a terminal holding wall side while the engaging portion formed on the opposite side of the terminal holding wall relative to the regulating surface engages the regulating surface from an opposite side of the terminal holding wall.

In the present invention, when the mating connector is extracted, the elastic deformation of the fitting portion is regulated by the engagement of the regulating surface and the engaging portion, and the elastic deformation of the fitting portion is continuously regulated while the mating connector is extracted. Accordingly, it is possible to prevent the terminal of the connector from coming off.

According to the present invention, it is possible to enlarge dimensions of the regulating wall portion without enlarging a size of the connector. Thus, an area of the regulating surface engaging with the engaging portion can be larger. As a result, the engaging portion can engage with the regulating wall portion securely. Thus, it is possible to prevent the terminal of the connector from coming off sufficiently even in the case that the engaging portion varies a positioning thereof due to a manufacturing error or an assembling error.

In the present invention, the regulating wall portion of the housing extends in the connecting direction of the connectors. Accordingly, the regulating wall portion can be formed by removing a mold from an opening where the mating connector is connected. Thus, it is unnecessary to open a hole in a bottom wall portion of the connector for removing the mold, and the bottom wall portion can obtain a sufficient strength. Furthermore, when the connector is mounted on a circuit board, the bottom wall portion prevents an electrical conduction between the terminal and the circuit board, so that an electric property is not deteriorated.

BRIEF DESCRIPTION OF THE DRAWINGS

FIGS. 4(A) to 4(C) are sectional views taken along a plane perpendicular to a terminal aligning direction of the electrical connector showing a process of extracting the mating connector from the electrical connector according to the first embodiment of the present invention, wherein FIG. 4(A) is a sectional view when the electrical connector is connected to the mating connector, FIG. 4(B) is a sectional view when the mating connector is in the halfway of the extraction, and FIG. 4(C) is a sectional view when the extraction of the mating connector is completed;

FIGS. 7(A) to 7(C) are sectional views taken along a plane perpendicular to the terminal aligning direction of the electrical connector showing a process of extracting the mating connector from the electrical connector according to the second embodiment of the present invention, wherein FIG. 7(A) is a sectional view when the electrical connector is connected to the mating connector, FIG. 7(B) is a sectional view when the mating connector is in the halfway of the extraction, and FIG. 7(C) is a sectional view when the extraction of the mating connector 2 is completed;

DETAILED DESCRIPTION OF THE PREFERRED EMBODIMENTS

Hereunder, embodiments of the present invention will be explained with reference to the accompanying drawings.

First Embodiment

Figure 1:
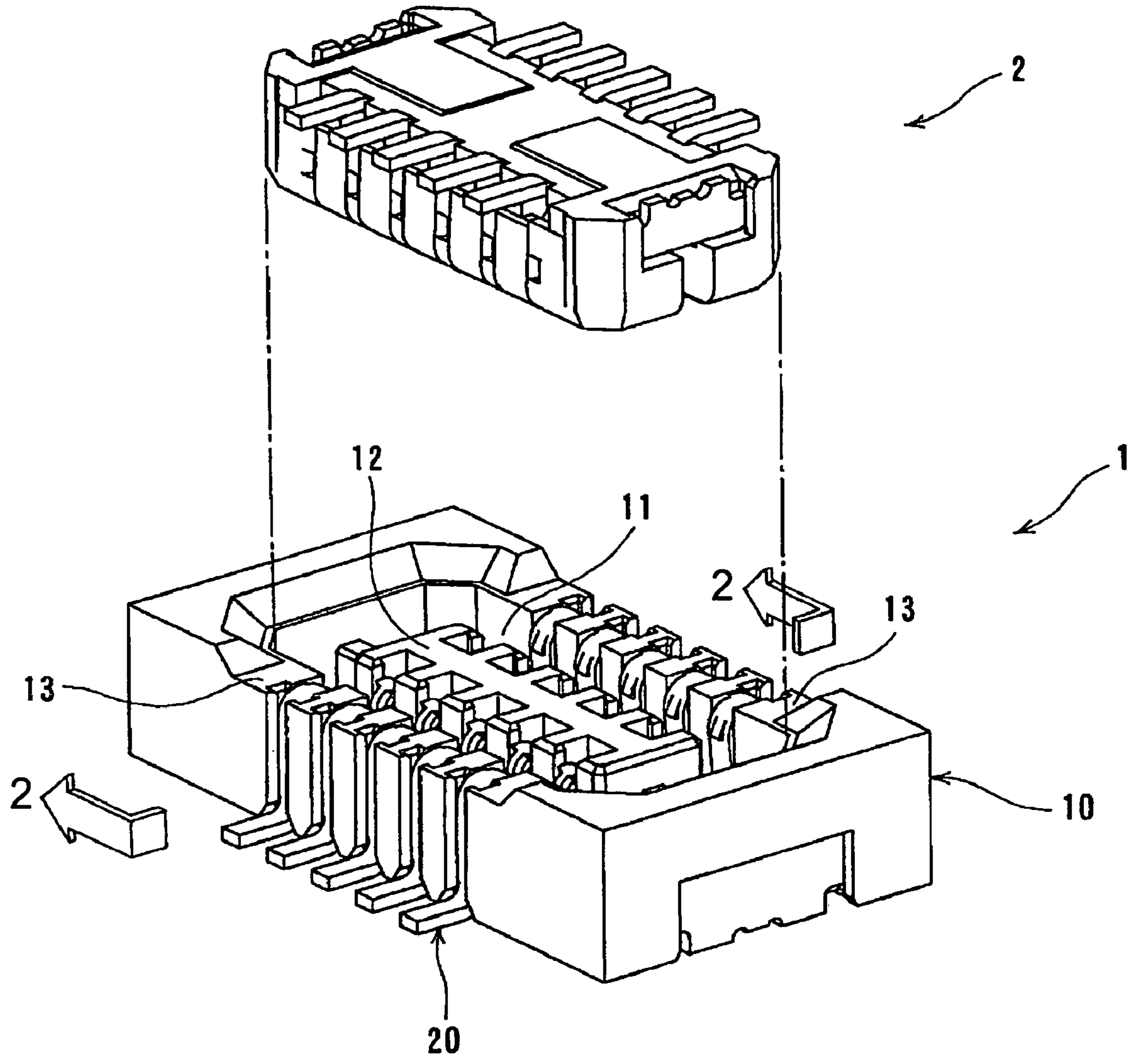
FIG. 1 is a perspective view showing an electrical connector and a mating connector to be connected to the electrical connector according to a first embodiment of the present invention.

FIG. 1 is a perspective view showing an electrical connector 1 (connector) and a mating connector 2 to be connected thereto according to a first embodiment of the present invention.

The connector 1 includes a housing 10 with an approximate rectangular solid shape and made of a synthetic resin; and a plurality of terminals 20 aligned and held in the housing 10. The housing 10 includes a receptacle recess portion 11 inside a circumference wall thereof for connecting the mating connector 2; and a central wall 12 having an approximate rectangular solid shape and located insularly at a central portion of the receptacle recess portion 11. Accordingly, the receptacle recess portion 11 is formed by an inner surface of the circumference wall, an outer circumference surface of the central wall 12, and an inner surface of a bottom wall of the housing 10. Two wall portions of the circumference wall of the housing 10 facing each other and extending in a longitudinal direction are formed as terminal holding walls 13 for holding the terminals 20.

The terminals 20 are aligned and held by the terminal holding walls 13 in the longitudinal direction of the housing 10 with a specific interval, and each of the terminals 20 held by one of the terminal holding walls 13 faces another of the terminals 20 held by the other of the terminal holding walls 13.

The mating connector 2 has an approximate rectangular solid shape having an outer circumference surface which nearly matches with the inner surface of the circumference wall of the connector 1. The mating connector 2 includes a recess portion (not shown) for receiving the central wall 12 at a position corresponding to the central wall 12 of the connector 1 on a lower surface thereof in FIG. 1. When the receptacle recess portion 11 of the connector 1 receives the mating connector 2 and the recess portion of the mating connector 2 receives the central wall 12 of the connector 1, the connector 1 and the mating connector 2 are connected to each other.

Figure 2:
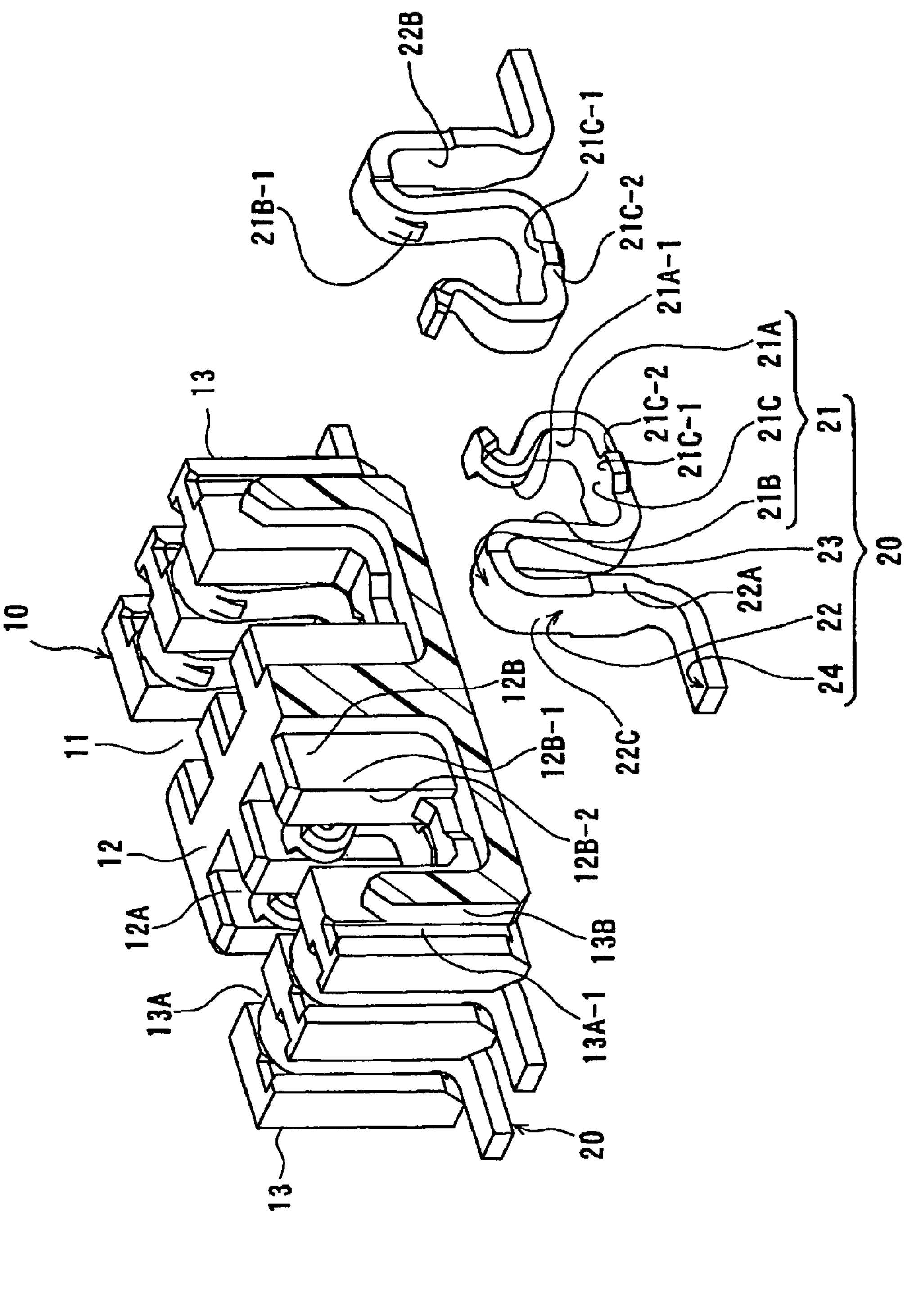
FIG. 2 is a partially sectional perspective view showing the electrical connector taken along a line 2-2 in FIG. 1 according to the first embodiment of the present invention.

FIG. 2 is a sectional perspective view showing a partial view in the longitudinal direction of the connector 1 taken along a line 2-2 in FIG. 1. One pair of the terminals 20 facing one another is omitted in FIG. 2.

In the embodiment, each of the terminals 20 has the same shape and formed by bending a metal plate in a thickness direction of the metal plate into a laterally facing S-shape. The terminal 20 includes a fitting portion 21 having an approximate U-shape opening in a connecting direction of the connectors; a held portion 22 having an approximate straight shape extending downward in FIG. 2 and combined an end portion of the fitting portion 21 through a transition portion 23 and held by the terminal holding wall 13; the transition portion 23 for transition from the fitting portion 21 to the held portion 22; and a connecting portion 24 to be connected to a corresponding circuit portion of a circuit board (not shown) combined an end of the held portion 22 and extending horizontally in an opposite direction of the fitting portion 21.

The fitting portion 21 receives a mating terminal (not shown) of the mating connector 2 into the opening thereof and contacts to the mating terminal of the mating connector 2. The fitting portion 21 includes a contact arm portion 21A having a curving shape extending in the connecting direction of the connectors (a vertical direction); a facing arm portion 21B facing the contact arm portion 21A and extending in the vertical direction; and a linking portion 21C extending horizontally for linking a lower end of the contact arm portion 21A and a lower end of the facing arm portion 21B. The contact arm portion 21A is capable of an elastic deformation in the thickness direction of the metal plate.

A contact portion 21A-1 is formed by bending an open end of the contact arm portion 21A toward the facing arm portion 21B in the thickness direction of the metal plate. When the connectors are connected, the contact portion 21A-1 contacts elastically to the mating terminal while the fitting portion 21 receives the mating terminal.

A locking portion 21B-1 protruding toward the contact arm portion 21 is formed by embossing at an upper side of the facing arm portion 21B. A locked portion may be formed on the mating terminal, as a recess for receiving the locking portion 21B-1 at a corresponding position to the locking portion 21B-1. When the connectors are connected, it is possible to prevent the mating connector 2 from unexpectedly coming off by forming the locked portion and engaging the locking portion 21B-1 with the locked portion in the connecting direction of the connectors. The linking portion 21C includes an engaging portion 21C-1 (described later) protruding in a width direction of the terminal 20 at the both ends in the width direction thereof. The engaging portion 21C-1 further includes a regulated surface 21C-2 (described later) extending in the connecting direction of the connectors and the width direction of the terminal at one end closer to the contact arm portion 21A thereof.

The held portion 22 includes a wider portion 22A at a lower part thereof and is formed so as to have a wider width than other part thereof. As described later, the held portion 22 is held by receiving a pressure from the terminal holding wall 13 of the housing 10 at lateral faces of the wider portion 22A thereof, that is, surfaces of the thickness part of the metal plate, of the wider portion 22A.

Both of the terminal holding walls 13 of the housing 10 include a plurality of a terminal holding grooves 13A aligned with a specific interval in a terminal aligning direction, that is, in the longitudinal direction of the terminal holding wall 13. Each of the terminal holding grooves 13A has inner surfaces perpendicular to the terminal aligning direction. The inner surfaces of the terminal holding groove 13A facing each other are linked through a linking wall portion 13B protruding from a portion of the surfaces and extending in the vertical direction. The inner surface of the terminal holding groove 13A includes a retaining groove 13A-1 at a farther position than the linking wall portion 13B from the receptacle recess portion 11 penetrating in the vertical direction.

As shown in FIG. 2, a part of inner surfaces of the retaining groove 13A-1, that is, one of the inner surfaces of the retaining groove 13A-1 extending in the connecting direction of the connectors and the terminal aligning direction and located at a closer position to the receptacle recess portion 11 is flush with an outer surface of the linking wall portion 13B extending in the connecting direction of the connectors and located at a farther side from the receptacle recess portion 11.

The central wall 12 of the housing 10 includes a containing groove 12A penetrating straight in the vertical direction for containing the contact arm portion 21 of the terminal 20 on a surface facing the terminal holding groove 13 and extending in the terminal aligning direction thereof. The containing groove 12A is situated at a position facing the terminal holding groove 13A of the terminal holding wall 13. As shown in FIG. 2, two of the containing grooves 12A adjacent to each other are separated by a separating wall portion 12B extending in the vertical direction.

As described later, a regulating wall portion 12B-1 extending in the vertical direction and being closer to the terminal holding wall 13 for engaging with the engaging portion 21C-1 of the terminal 20 is formed in a neighborhood area of corners of the separating wall portion 12B. The regulating wall portion 12B-1 includes a regulating surface 12B-2 extending in the connecting direction of the connectors and the terminal aligning direction and facing the terminal holding wall 13 for abutting against a regulated surface 21C-2 of the engaging portion 21C-1.

The terminal 20 has a laterally facing S-shape with the fitting portion 21 thereof opening toward the connecting direction of the connectors. A width direction of the terminal 20 is aligned with the terminal aligning direction. In a state that the connecting portion 24 extends outward from the connector 1, the terminal 20 is embedded into the housing 10 by being inserted into the receptacle recess portion 11 of the housing 10 from a direction the mating connector 2 is connected. More specifically, the terminal 20 is held with the terminal holding wall 13 by inserting the held portion 22 with a pressure into the retaining groove 13A-1 and retaining the wider portion 22A of the held portion 22 with the retaining groove 13A-1.

In the embodiment, when the terminal 20 is fixed to the housing 10, an inner plate surface 22B of the held portion 22, facing the fitting portion 21 has a plane contact with one of the inner surfaces of the holding groove 13A-1 closer to the receptacle recess portion 11. Furthermore, an outer plate surface 22C facing the opposite direction from the fitting portion 21 has a plane contact with one of the inner surfaces of the holding groove 13A-1 farther from the receptacle recess portion 11 (shown in FIG. 4(A)).

Figure 4C:
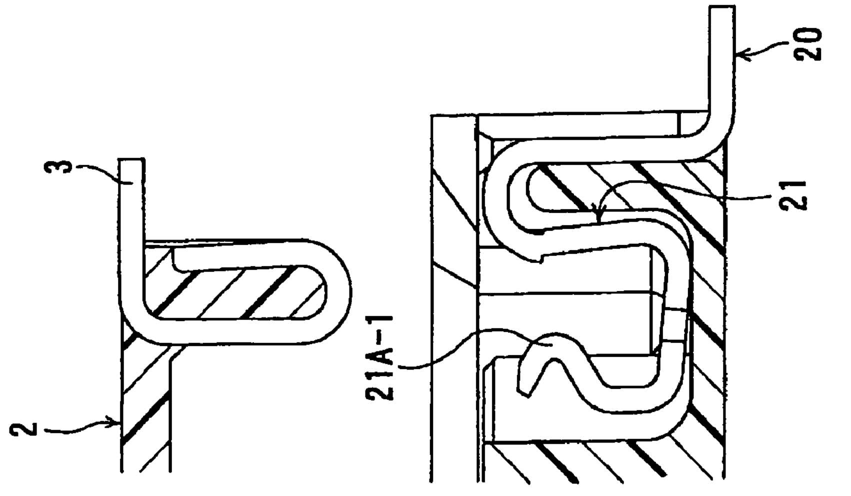
Figure 4B:
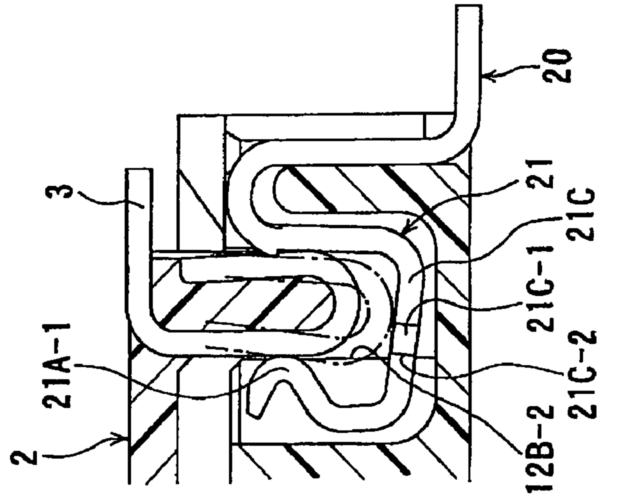
Figure 4A:
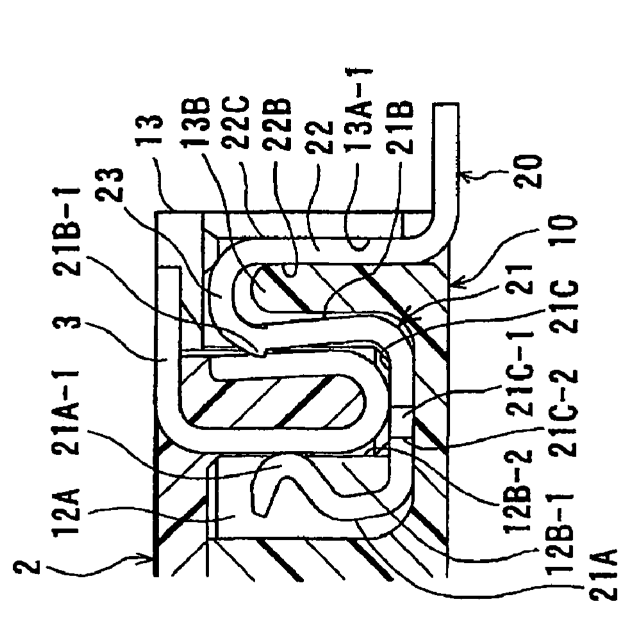

As shown in FIG. 4(A), when the terminal 20 is held by the terminal holding wall 13, the linking wall portion 13B of the terminal holding wall 13 enters an upside down U-shape portion formed with the facing arm portion 21B, the transition portion 23, and the held portion 22 of the terminal 20 from a lower side of the connector 1. The held portion 22 of the terminal 20 extends along the linking wall portion 13B and has the plane contact with the inner plate surface 22B facing the fitting portion 21 of the held portion 22 (shown in FIG. 4(A)). Further, as shown in FIG. 2, the contact arm portion 21A is contained in the containing groove 12A, and the contact portion 21A-1 of the contact arm portion 21A protrudes toward the receptacle recess portion 11.

Figure 3:
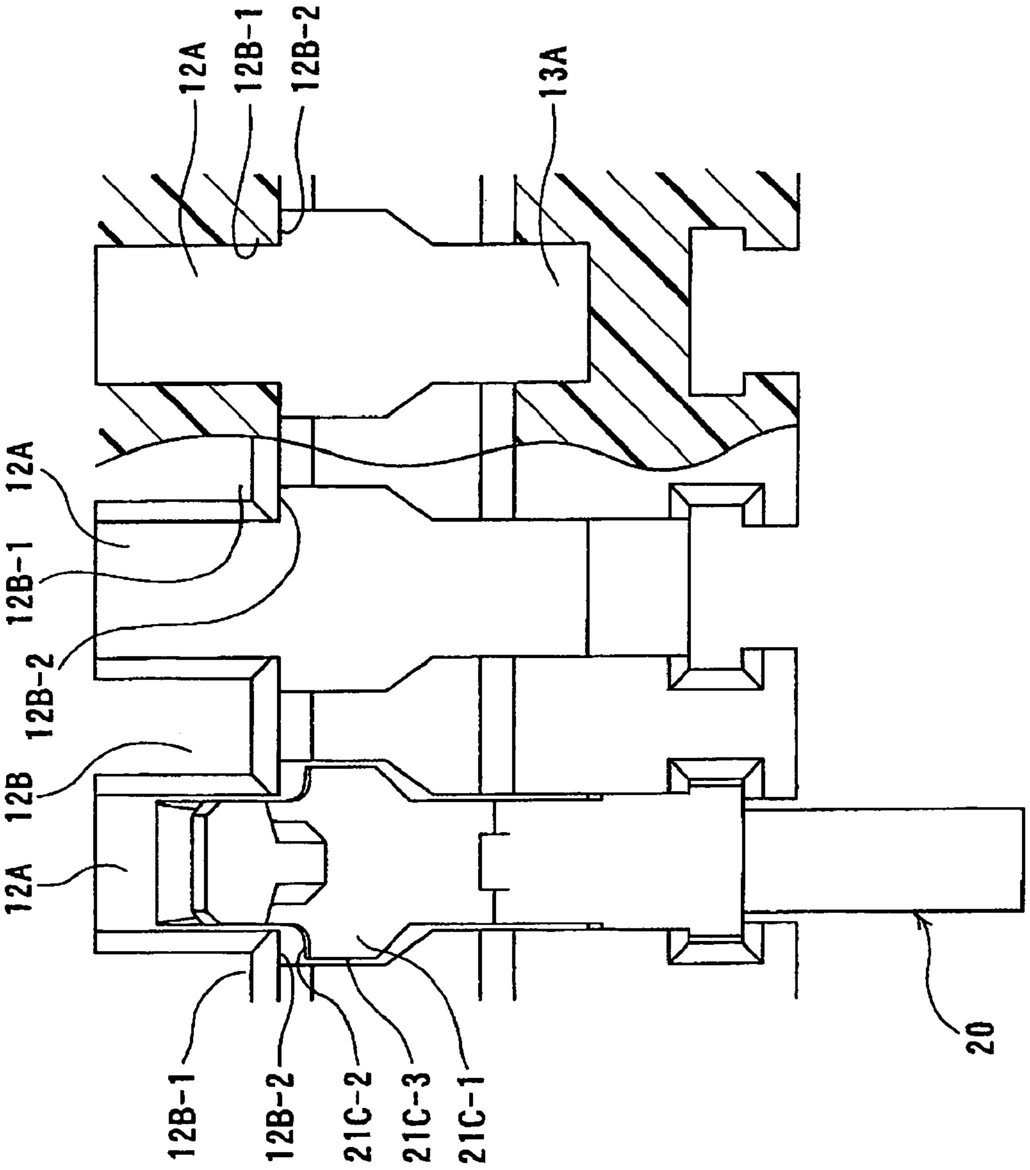
FIG. 3 is a partially sectional plain view showing the electrical connector according to the first embodiment of the present invention.

FIG. 3 is a partially sectional plain view showing a portion of the connector 1. In FIG. 3, three pairs of the containing groove 12A and the terminal holding groove 13A facing each other are shown. For easy understanding of the shapes of the containing groove 12A and the terminal holding groove 13A, from the left to the right, each of the pairs shows when the terminal 20 is embedded, when the terminal 20 is not embedded, and a sectional view taken at the middle in the connecting direction of the connectors when the terminal 20 is not embedded.

As shown in FIG. 3, the regulated surface 21C-2 located at the engaging portion 21C-1 of the terminal 20 is positioned outside the containing groove 12A in a direction facing the containing groove 12 and the terminal holding wall 13A. The regulating wall portion 12B-1 of the housing 10 is positioned inside than a protruding end surface 21C-3 of the engaging portion 21C-1 in the width direction of the terminal 20. The regulating surface 12B-2 faces the regulated surface 21C-2 of the engaging portion 21C-1.

FIGS. 4(A)-(C) are sectional views taken along a perpendicular direction of the terminal aligning direction showing a procedure of extracting the mating connector 2 from the connector 1. FIG. 4(A) is a sectional view showing when the mating connector 2 is connected to the connector 1, FIG. 4(B) is a sectional view showing the halfway of the extracting operation, and FIG. 4(C) is a sectional view showing when the mating connector 2 is extracted, respectively. In FIGS. 4(A)-(C), only the housing 10 is shown as a sectional view, while the terminal 20 is not shown as a sectional view. Additionally, in FIGS. 4(A)-(C), one of two terminals facing each other is shown. An explanation about another terminal is omitted since it is possible to be explained in the same way with one of the terminals.

As shown in FIG. 4(A), when the connectors are connected to each other, the contact arm portion 21A deforms elastically toward the left in FIG. 4(A) by pressing the contact portion 21A-1 of the terminal 20 with the mating terminal 3. Due to the elastic deformation, the contact portion 21A-1 can keep contacting with the mating terminal 3 with a contact pressure at a position deformed toward the containing groove 12A. The regulated surface 21C-2 of the engaging portion 21C-1 of the terminal 20 is positioned adjacent to the regulating surface 12B-2 of the housing 10, having a clearance in between.

As described above, the contact portion 21A-1 contacts the mating terminal 3 with the contact pressure. Thus, a frictional resistance is generated between the contact portion 21A-1 and the mating terminal 3 when the extracting operation of the mating connector 2 begins by pulling the mating connector 2 straight upwardly.

In the embodiment, as shown in FIG. 4(A)-(C), the held portion 22 of the terminal 20 has the plane contact with the inner surface of the retaining groove 13A-1 at the inner plate surface 22B and the outer plate surface 22C thereof, thus a deformation of the held portion 22 in the width direction of the metal plate is regulated. Accordingly, when a force generated by the frictional resistance in a extracting direction of the mating connector 2, that is, in an upward direction performs action to the contact portion 21A-1, the fitting portion 21 deforms toward the extracting direction of the mating connector 2 and deforms elastically so as to rotate clockwise in FIG. 4(B) around the transition portion 23 as a pivot. An engaging force between the locking portion 21B-1 of the terminal 20 and the locked portion of the mating terminal 3 is as strong as preventing unexpected coming off of the connectors. Accordingly, the engaging force does not prevent the mating connector from being extracted.

As the extracting operation of the mating connector 2 proceeds, the regulated surface 21C-2 of the engaging portion 21C-1 abuts against and engages with the regulating surface 12B-2 of the housing 10 from the right side in FIG. 4(B). Accordingly, further elastic deformation of the fitting portion 22 is regulated. As a result, even when the extracting operation of the mating connector 2 is not stopped, the regulating surface 12B-2 keeps engaging with the engaging portion 21C-1 until the mating connector 2 is extracted completely, and it is possible to prevent the terminal 20 from coming off.

As shown as a projected line in FIG. 4(B), when the mating connector 2 is extracted with a twisting force, the fitting portion 21 of the terminal 20 deforms elastically, and the elastic deformation is regulated by the regulating surface 12B-2 of the housing 10 similar to the case that the mating connector 2 is extracted straight upwardly. As a result, it is possible to prevent the terminal 20 from coming off when the mating connector 2 is extracted with the twisting force.

When the mating connector 2 is extracted completely, the force toward the extracting direction of the mating connector 2 generated by the frictional resistance does not perform action to the contact portion 21A-1 of the terminal 20. Accordingly, the fitting portion 21 is released from the elastic deformation, and returns to a state before the connectors are connected as shown in FIG. 4(C).

In the embodiment, an area of the regulating surface 12B-2 engaging with the engaging portion 21C-1 of the terminal 20 can be larger by enlarging dimensions of the regulating wall portion 12B-1 of the housing 10 in the connecting direction of the connectors. It is possible to enlarge the dimensions of the regulating wall portion 12B-1 without enlarging a size of the connector. As a result, by enlarging the area of the regulating surface 12B-2, it is possible to prevent the terminal 20 of the connector 1 from coming off since the engaging portion 21C-1 can engage with the regulating surface 12B-2 securely, even in the case that the engaging portion 21C-1 varies a position thereof due to a manufacturing error or an assembling error.

In the embodiment, the regulating wall portion 12B-1 of the housing 10 extends in the connecting direction of the connectors straight without having a step portion. Accordingly, the regulating wall portion 12B-1 can be formed by removing a mold from an opening of the receptacle recess portion 11. Thus, it becomes unnecessary to open a hole in a bottom wall portion of the connector 1 for removing the mold. As a result, the bottom wall portion can obtain a sufficient strength. Furthermore, when the connector 1 is mounted on a circuit board, electrical conduction between the terminal 20 and the circuit board does not occur, thereby preventing a deterioration of an electric property thereof.

In the embodiment, the elastic deformation of the held portion 22 is regulated when both of the inner plate surface 22B and the outer plate surface 22C have the plain contacts with the inner surfaces of the retaining groove 13A-1. It is still possible to prevent the terminal 20 from coming off even when the elastic deformation of the held portion 22 is not regulated due to a space between the plate surfaces of the held portion 22 and the retaining groove 13A-1 or an insufficient strength of a portion of the housing 10 constituting the retaining groove 13A-1 caused by the manufacturing error and the like. When the elastic deformation of the held portion 22 is not regulated, the terminal 20 moves upward and deforms elastically by rotating around the lower end portion of the held portion 22 as the pivot. Then, the engaging portion 21C-1 abuts against the regulating surface 12B-2 of the regulating wall portion 12B-1, and the engaging portion 21C-1 engages with the regulating surface 12B-2. As a result, it is possible to prevent the terminal 20 from coming off.

Second Embodiment

In the second embodiment, a basic structure of the connector 1 is the same as the connector 1 in the first embodiment. Accordingly, differences from the first embodiment will be mainly explained. The same reference numerals as the first embodiment denote the same components, respectively, and explanations thereof are omitted.

Figure 5:
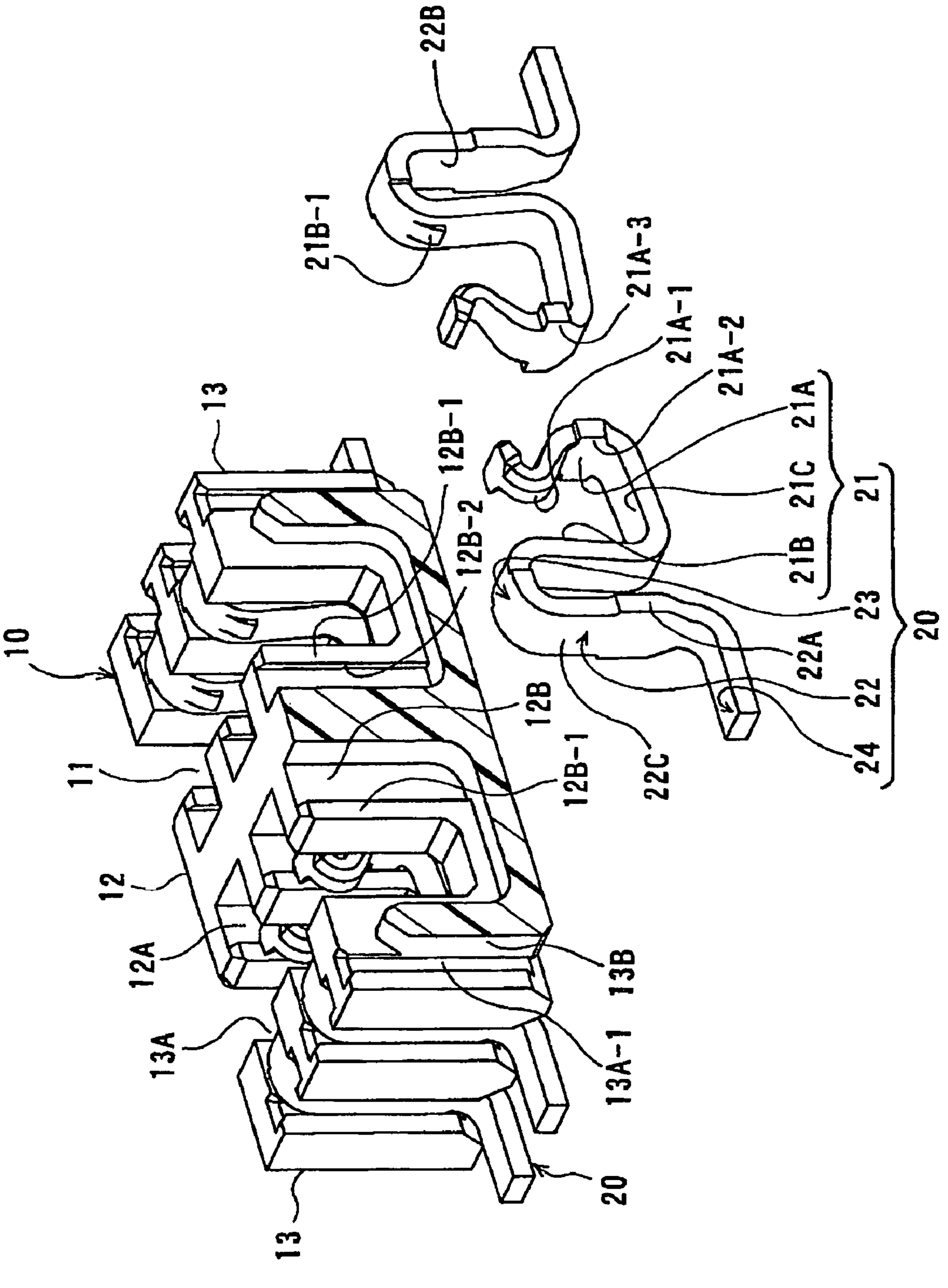
FIG. 5 is a partially sectional perspective view showing an electrical connector taken along a plane perpendicular to a terminal aligning direction thereof according to a second embodiment of the present invention.

FIG. 5 is a sectional view showing a partial view of the connector 1 in the connecting direction of the connectors taken along a plane perpendicular to the connecting direction of the connectors according to a second embodiment of the present invention. In FIG. 5, one pair of the terminals 20 facing one another is shown as being removed from the housing 10.

In the embodiment, the engaging portion 21A-2 is formed on the contact arm portion 21A of the terminal 20 of the connector 1 instead of the linking portion 21C. As shown in FIG. 5, the engaging portion 21A-2 of the contact arm portion 21A is formed at a lower area of the contact portion 21A-1. The regulated surface 21A-3 (described later) is formed with the surface located closer to the central wall portion 12 and extending in the connecting direction of the connectors and the width direction of the terminal 20.

Further, in the embodiment, the regulating wall portion 12B-1 of the housing 10 has a shape with the separating wall portion 12B protruding straight in the vertical direction at a side edge close to the terminal holding wall portion 13 thereof toward an inside of the containing groove 12A. As described later, a surface of the side edge of the regulating wall portion 12B-1 protruding toward inside the containing groove 12 is formed as the regulating surface 12B-2 abutting against the regulating surface 21A-3 at the engaging portion 21A-2 of the terminal 20.

Figure 7C:
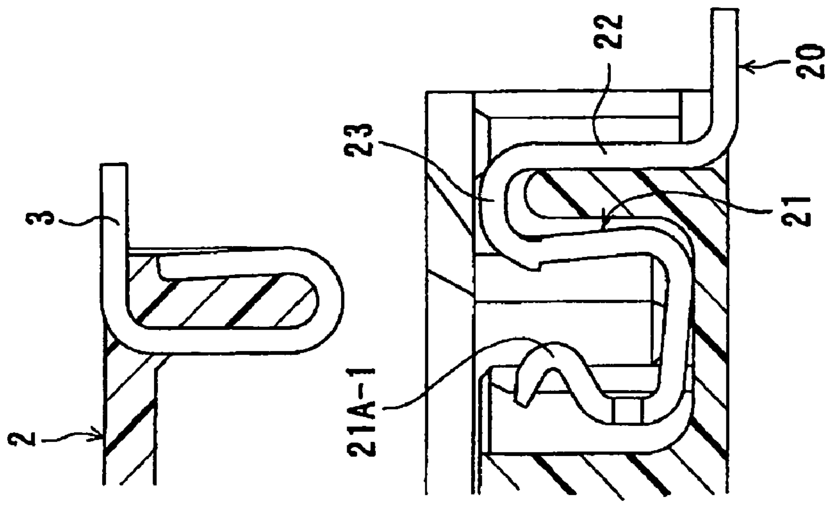
Figure 7B:
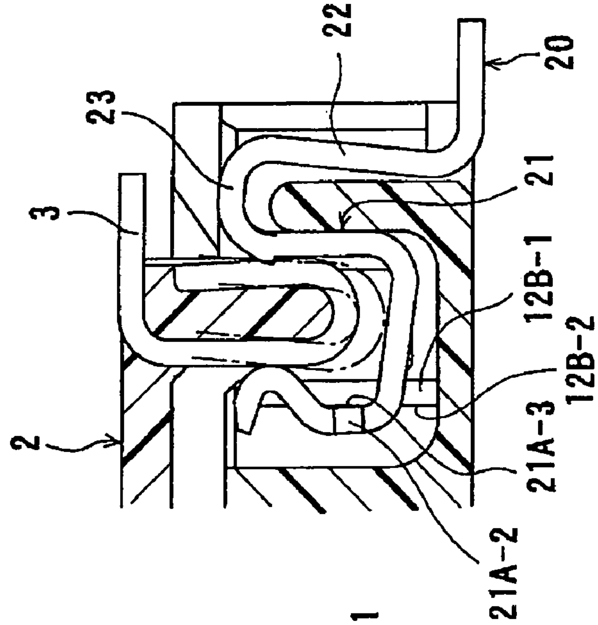
Figure 7A:
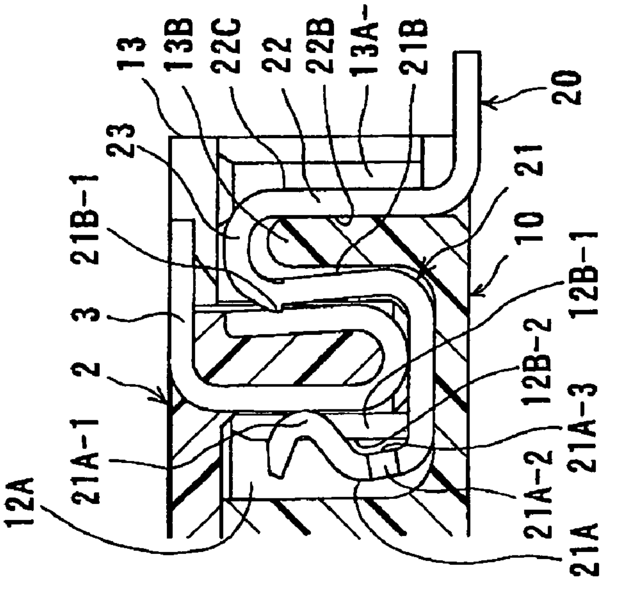

In the embodiment, as shown in FIGS. 7(A)-7(C), a width of the retaining groove 13A-1 of the housing 10 in the horizontal direction is slightly larger than the width of the retaining groove 13A-1 in the first embodiment, and there is a space between the outer plate surface 22C of the held portion 22 and the inner surface of the retaining groove 13A-1 facing to the outer plate surface 22C.

Figure 6:
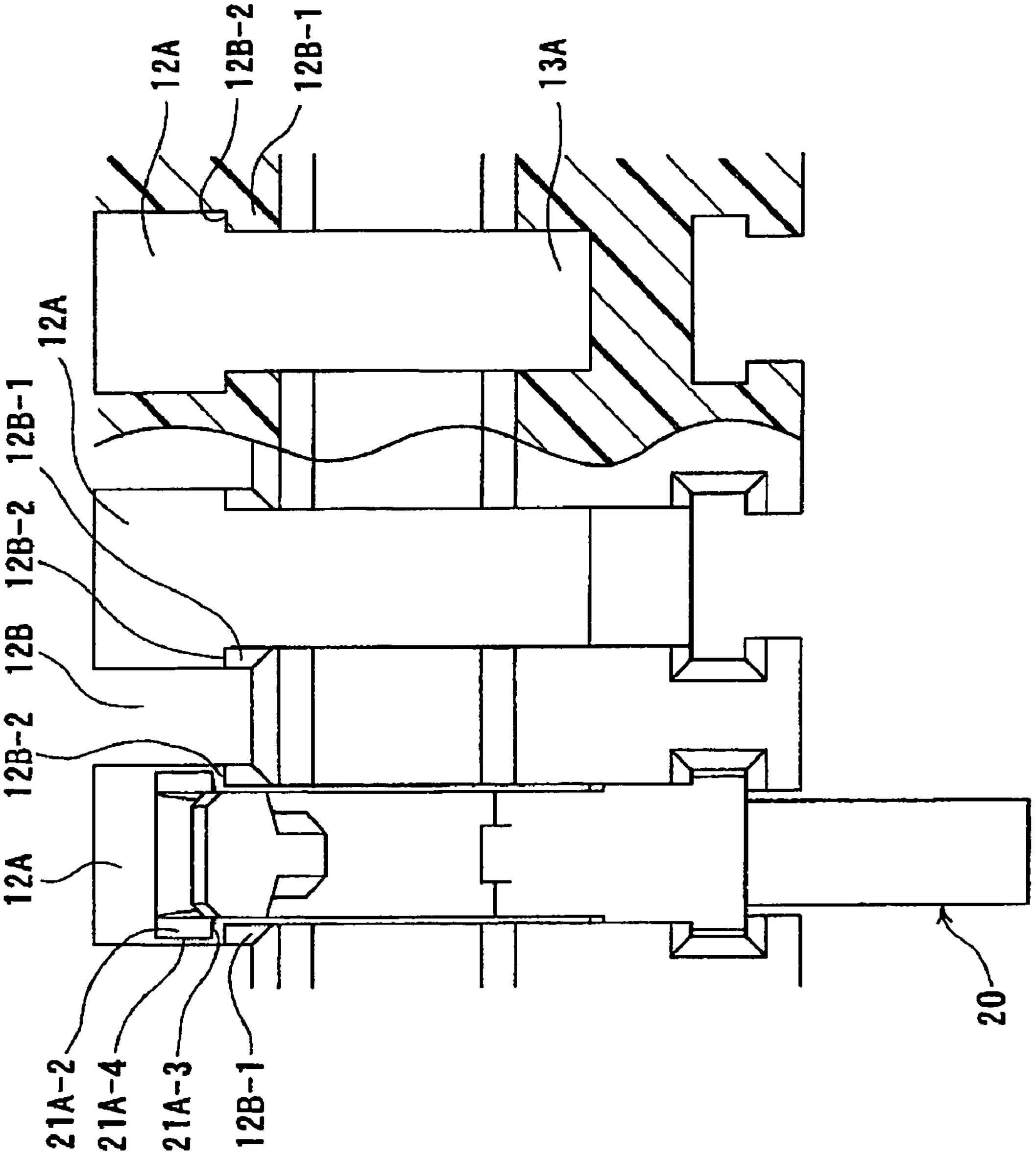
FIG. 6 is a partially sectional plain view showing the connector according to the second embodiment of the present invention.

FIG. 6 is a partial sectional plain view showing a portion of the connector 1. Similar to those shown in FIG. 3, three pairs of the containing groove 12A and the terminal holding groove 13A facing each other are shown in FIG. 6. For easy understanding of the shapes of the containing groove 12A and the terminal holding groove 13A, from the left to the right, each of the pairs shows when the terminal 20 is embedded, when the terminal 20 is not embedded, and a sectional view taken at the middle in the connecting direction of the connectors when the terminal 20 is not embedded.

As shown in FIG. 6, the regulated surface 21A-3 at the engaging portion 21A-2 of the terminal 20 is positioned inside the containing groove 12A in the direction facing the containing groove 12 and the terminal holding wall 13A. The regulating wall portion 12B-1 of the housing 10 is located inside than a protruding end surface 21A-4 of the engaging portion 21A-2 in the width direction of the terminal 20. The regulating surface 12B-2 faces the regulated surface 21A-3 of the engaging portion 21A-2.

FIGS. 7(A)-(C) are sectional views taken along a perpendicular direction of the terminal aligning direction showing a procedure of an extracting operation of the mating connector 2 from the connector 1. FIG. 7(A) is a sectional view showing when the mating connector 2 is connected to the connector 1, FIG. 7(B) showing the halfway of the extracting operation and FIG. 7(C) a sectional view showing when the mating connector 2 is extracted, respectively. In FIGS. 7(A)-(C), only the housing 10 is shown as a sectional view, while the terminal 20 is not shown as a sectional view.

As shown in FIG. 7(A), when the connectors are connected to each other, the contact arm portion 21A deforms elastically toward the left in FIG. 7(A) by pressing the contact portion 21A-1 of the terminal 20 with the mating terminal 3. Due to the elastic deformation, the contact portion 21A-1 can keep contacting with the mating terminal 3 with a contact pressure at a position deformed toward the containing groove 12A. The regulated surface 21C-2 of the engaging portion 21C-1 of the terminal 20 is positioned adjacent to the regulating surface 12B-2 of the housing 10, having a clearance in between.

As described above, in the embodiment, the width of the retaining groove 13A-1 is slightly larger than the width of the retaining groove 13A-1 in the first embodiment, and as shown in FIGS. 7(A)-(C), the space is formed between the outer plate surface 22C of the held portion 22 and the inner surface of the retaining groove 13A-1 facing the outer plate surface 22C. Accordingly, the held portion 22C can deform elastically toward an outside the connector 1 in the thickness direction of the held portion 22.

When the extracting operation of the mating connector 2 begins by pulling the mating connector 2 straight upwardly, a frictional resistance is generated between the contact portion 21A-1 and the mating terminal 3. When an upward force due to the frictional resistance performs action to the contact portion 21A-1, as shown in FIG. 7(B), the terminal 20 deforms elastically at a consecutive portion of the fitting portion 21, the transition portion 23 and the held portion 22 thereof so as to rotate clockwise around an area close to the lower edge of the held portion 22 as the pivot.

As the extracting operation of the mating connector 2 proceeds, the regulated surface 21A-3 at the engaging portion 21A-2 abuts against and engages with the regulating surface 12B-2 of the housing 10 from the right side in FIG. 7(B). Accordingly, the elastic deformation of the terminal 20 is further regulated. As a result, even when the extracting operation of the mating connector 2 continues, the regulating surface 12B-2 keeps engaging with the engaging portion 21A-2 until the mating connector 2 is extracted completely, and it is possible to prevent the terminal 20 from coming off.

As shown as a projected line in FIG. 7(B), when the mating connector 2 is extracted with a twisting force, the terminal 20 deforms elastically, and the elastic deformation thereof is regulated by the regulating surface 12B-2 of the housing 10, similar to the case that the mating connector is extracted straight upwardly. As a result, it is also possible to prevent the terminal 20 from coming off when the mating connector is extracted with the twisting force.

When the mating connector 2 is extracted completely, the force toward the extracting direction of the mating connector 2 generated by the frictional resistance does not perform action to the contact portion 21A-1 of the terminal 20. Accordingly, the terminal 20 is released from the elastic deformation, and returns to a state before the connectors are connected as shown in FIG. 7(C).

In the embodiment, similar to the first embodiment, the area of the regulating surface 12B-2 engaging with the engaging portion 21A-2 can be larger by enlarging dimensions of the regulating wall portion 12B-1 of the housing 10 in the connecting direction of the connectors. It is possible to enlarge the dimensions of the regulating wall portion 12B-1 without enlarging the size of the connector. As a result, by enlarging the area of the regulating surface 12B-2, it is possible to prevent the terminal 20 of the connector 1 from coming off since the engaging portion 21A-2 can engage the regulating surface 12B-2 securely, even in the case that the engaging portion 21C-1 varies a position thereof due to the manufacturing error or the assembling error.

In the embodiment, it is possible to enlarge the area of the regulated surface 21A-3 by enlarging the dimensions of the engaging portion 21A-2 in a direction along the side end edge of the contact arm portion 21A, instead of the width direction of the terminal 20, i.e., the connecting direction of the connectors. It is possible to enlarge the dimensions of the engaging portion 21A-2 without enlarging the size of the connector. As a result, by enlarging the area of the regulated surface 21A-3, the engaging portion 21A-2 can engage with the regulating surface 12B-2 even more securely. Thus, it is possible to further prevent the terminal 20 of the connector 1 from coming off when the mating connector 2 is extracted.

In addition, in the embodiment, the regulating wall portion 12B-1 of the housing 10 extends in the connecting direction of the connectors straight without having a step portion. Accordingly, the regulating wall portion 12B-1 can be formed by removing a mold from an opening of the receptacle recess portion 11, similar to the first embodiment. Since it becomes unnecessary to open a hole in a bottom wall portion of the connector 1 for removing the mold, the bottom wall portion can obtain a sufficient strength. Furthermore, when the connector 1 is mounted on a circuit board, electrical conduction between the terminal 20 and the circuit board does not occur, thereby preventing a deterioration of an electric property thereof.

In the embodiment, the elastic deformation of the held portion 22 is not regulated due to a space between the plate surfaces of the held portion 22 and the retaining groove 13A-1. As explained in the first embodiment, when both of the inner plate surface 22B and outer plate surface 22C of the held portion 22 have the plain contacts with the inner surfaces of the retaining groove 13A-1, it is also possible to prevent the terminal 20 from coming off. When the elastic deformation of the held portion 22 is regulated, the terminal 20 moves upward and deforms elastically by rotating around the transition portion 23 as the pivot. Then, the regulated portion 21A-3 of the engaging portion 21A-2 abuts against and engages with the regulating surface 12B-2 of the regulating wall portion 12B-1. As a result, it is possible to prevent the terminal 20 from coming off.

Third Embodiment

In the third embodiment, a basic structure of the connector 1 is similar to that of the connector 1 in the first embodiment and the second embodiment. Accordingly, differences from the first embodiment or the second embodiment will be mainly explained. The same reference numerals as the first and second embodiments denote the same components, respectively, and explanations thereof are omitted.

Figure 8:
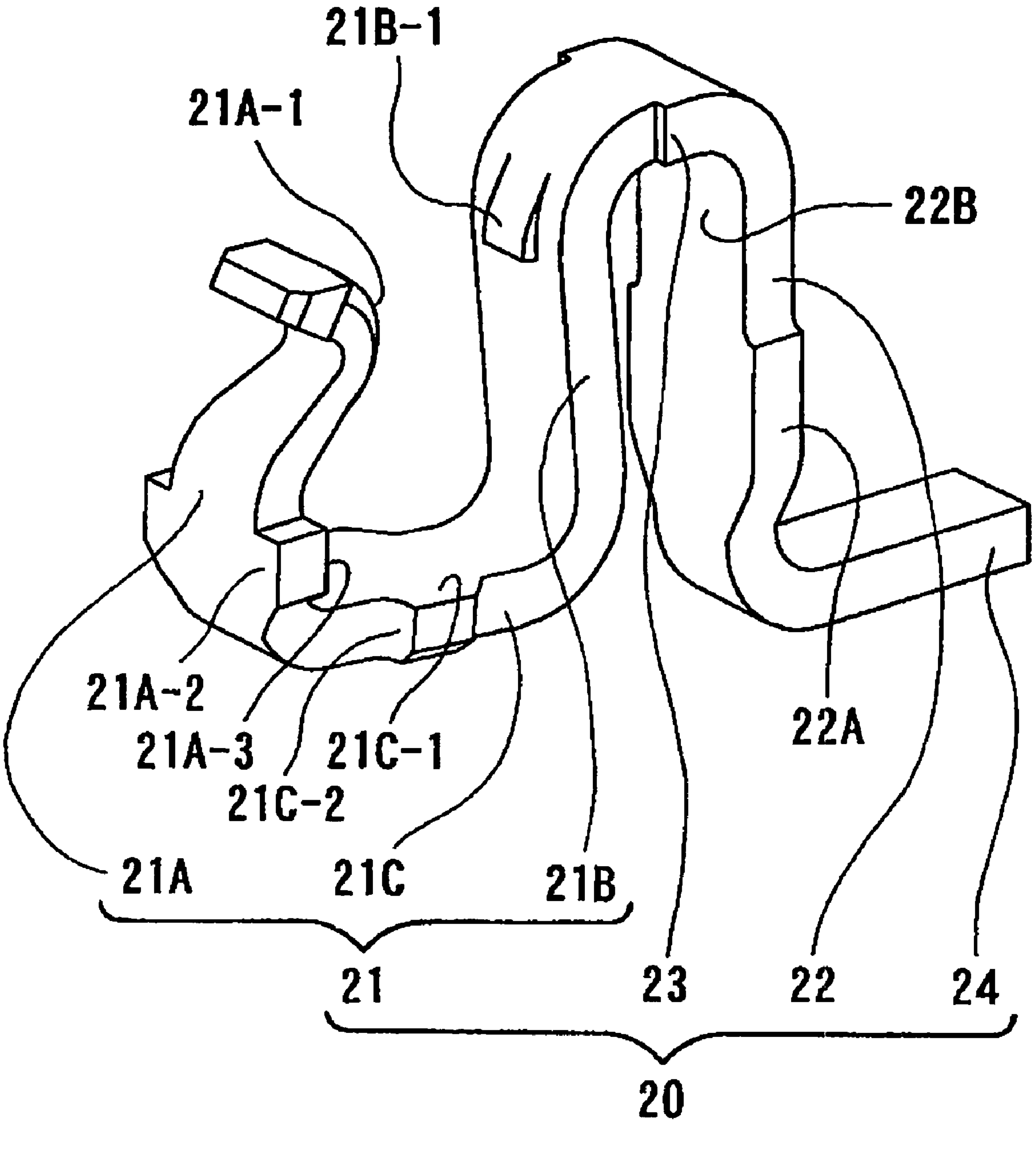
FIG. 8 is a perspective view showing a terminal of a electrical connector according to a third embodiment of the present invention.

FIG. 8 is a perspective view of the terminal 20 of the connector 1 according to the third embodiment. As shown in FIG. 8, the terminal 20 in the embodiment has the same basic structure as the terminal in the first and second embodiments. In the third embodiment, the terminal has two engaging portions at the side end edge thereof. More specifically, the terminal 20 has an engaging portion 21C-1 at the side end edge of the linking portion 21C and the engaging portion 21A-2 at the side end edge of the contact arm portion 21A, that is, the terminal 20 has a shape having both of the engaging portions in the first and second embodiments.

Figure 9:
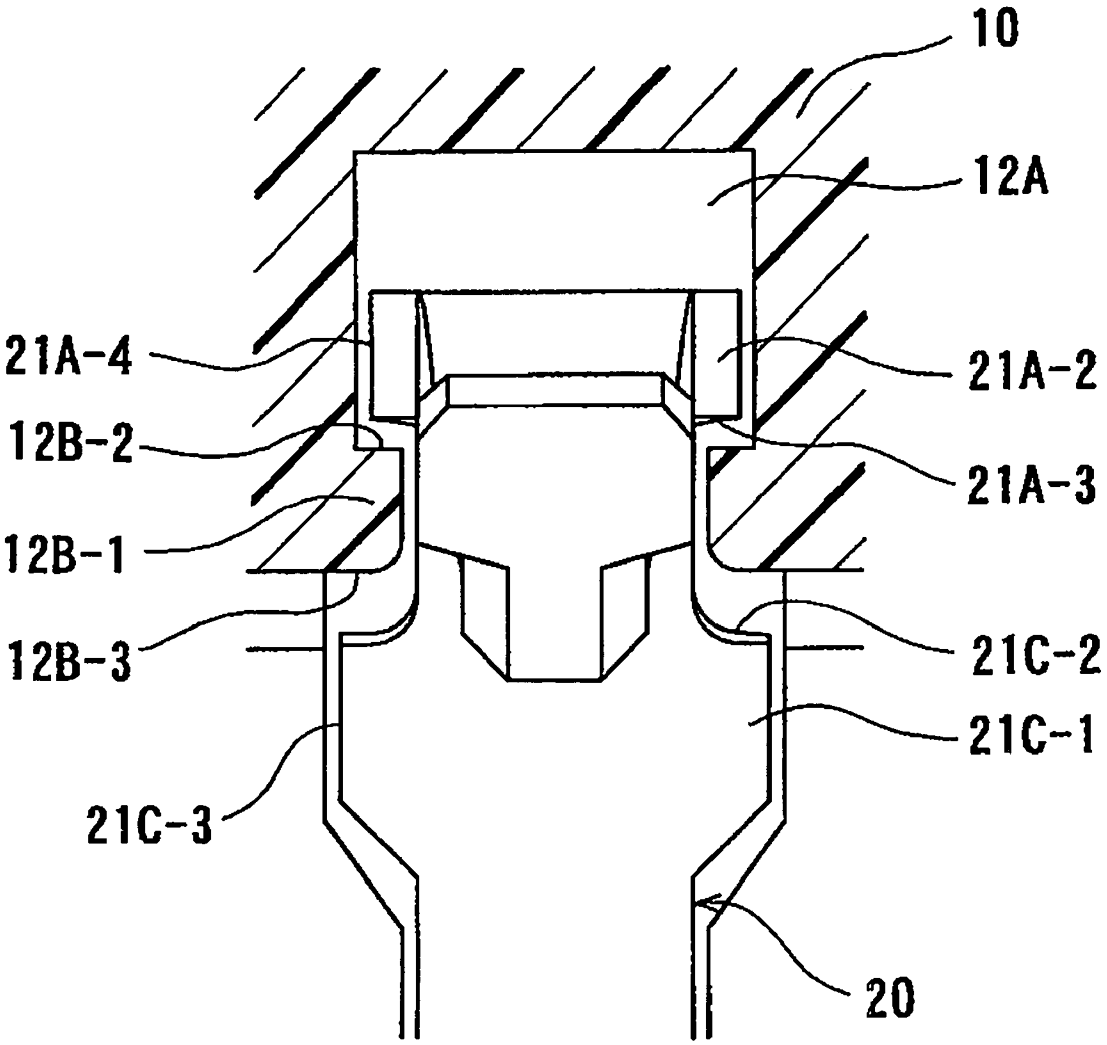
FIG. 9 is a partial sectional plain view showing the electrical connector according to the third embodiment of the present invention.

FIG. 9 is a partially sectional plain view showing a portion of the connector 1. In FIG. 9, an adjacent area of the engaging portions 21A-2 and 21C-1 of the terminal 20 and the regulating wall portion 12B-1 of the housing 10 are shown, and the housing 10 in FIG. 9 is shown as a sectional view along the middle position of the connecting direction of the connectors. As shown in FIG. 9, the regulated surface 21A-3 of the engaging portion 21A-2 is positioned inside the containing groove 12A in the direction facing the containing groove 12 and the terminal holding groove (not shown), while the regulated surface 21C-2 of the engaging portion 21C-1 is positioned outside the containing groove 12A in the same direction.

In the embodiment, similar to the second embodiment, as shown in FIG. 9, the regulating wall portion 12B-1 of the housing 10 has a shape with the separating wall portion 12B protruding straight in the vertical direction at a side edge close to the terminal holding wall portion (not shown) thereof toward inside the containing groove 12A. The regulated surface 12B-2 is formed with the surface of the side edge toward inside the containing groove 12A, that is, an upper side of the containing groove 12 of the regulating wall portion 12B-1 in FIG. 9. The regulated surface 12B-2 abuts against the regulating surface 21A-3 of the engaging portion 21A-2. In addition, the regulating surface 12B-3 is formed with the surface of the side edge toward outside the containing groove 12A, that is, in a lower side in FIG. 9. The regulating surface 12B-3 abuts against the regulating surface 21C-2 of the engaging portion 21C-1.

The regulating wall portion 12B-1 is located at an inside position in the width direction of the terminal 20 than the protruding end surfaces 21A-4 and 21C-3 of the engaging portions 21A-2 and 21C-2, respectively. The regulating surface 12B-2 of the regulating wall portion 12B-1 faces the regulated surface 21A-3 of the engaging portion 21A-2, and the regulating surface 12B-3 faces the regulated surface 21C-2 of the engaging portion 21C-1.

In the embodiment, similar to the first and second embodiments, when the mating connector 2 is extracted, the force generated by the frictional resistance between the contact portion 21A-1 and the mating terminal 3 performs action to the contact portion 21A-1 of the terminal 20 in the extracting direction of the mating connector 2. Similar to the first embodiment, when the elastic deformation of the held portion 22 is regulated by the inner surface of the retaining groove 13A-1, the fitting portion 21 deforms elastically around the transition portion 23 as the pivot. Furthermore, similar to the second embodiment, when the elastic deformation of the held portion 22 toward the outside the connector is not regulated, the consecutive portion of the fitting portion 21, the transition portion 23, and the held portion 22 deforms elastically around an area close to the lower edge of the held portion 22 as the pivot.

When the terminal 20 deforms elastically as described above, the regulating wall portion 12B-1 engages with either of the engaging portions 21A-2 and 21C-2, whichever abuts earlier and regulates the further elastic deformation of the terminal 20. For example, in the case that the regulated surface 21A-3 of the engaging portion 21A-2 abuts against the regulating surface 12B-2 of the regulating wall portion 12B-1 before the regulated surface 21C-2 of the engaging portion 21C-1 abuts against the regulating surface 12B-3 of the regulating wall portion 12B-1, the elastic deformation of the terminal 20 is regulated by the engagement of the regulating surface 12B-2 and the engaging portion 21A-2.

According to the embodiment, a fatigue or a damage of the terminal 20 can be prevented more certainly since the elastic deformation of the terminal 20 can be regulated in an earlier stage. Similar to the first and second embodiments, it is possible to prevent the terminal 1 from coming off, and the bottom wall portion of the housing 10 can obtain a sufficient strength.

The disclosure of Japanese Patent Application No. 2008-050123, filed on Feb. 29, 2008 is incorporated in the application by reference.

While the invention has been explained with reference to the specific embodiments of the invention, the explanation is illustrative and the invention is limited only by the appended claims.

What is claimed is:

1. An electrical connector to be connected to a mating connector, comprising:

a housing including a terminal holding wall and a containing groove, said containing groove including a regulating wall portion formed in an inner surface of the containing groove, said regulating wall portion including a regulating surface, said regulating surface extending in a direction that the electrical connector is connected to the mating connector; and a terminal including a held portion held in the terminal holding wall and a fitting portion capable of an elastic deformation for receiving the mating connector and contained in the containing groove, said fitting portion including an engaging portion on a side edge thereof, said engaging portion being situated away from the regulating surface so that the fitting portion elastically deforms and the engaging portion abuts against the regulating surface for regulating the elastic deformation of the fitting portion only when the mating connector is extracted.

2. The electrical connector according to claim 1, wherein said terminal is formed of a metal plate bent in a thickness direction thereof.

3. The electrical connector according to claim 1, wherein said terminal is formed in a U character shape so that the mating connector is accommodated in an opening portion of the U character shape.

4. The electrical connector according to claim 1, wherein said regulating surface is formed on an inner surface of the regulating wall portion at a position inside the containing groove relative to an edge surface of the engaging portion in a width direction of the terminal.

5. The electrical connector according to claim 1, wherein said held portion extends along a wall surface of the terminal holding wall.

6. The electrical connector according to claim 1, wherein said fitting portion is connected to the held portion at a position near the terminal holding wall so that the fitting portion deforms elastically with a transition portion between the held portion and the fitting portion as a pivot.

7. The electrical connector according to claim 1, wherein said fitting portion is connected to the held portion at a position near the terminal holding wall so that the fitting portion deforms elastically with a portion of the held portion away from the fitting portion thereof as a pivot.

8. The electrical connector according to claim 1, wherein said engaging portion is formed on at least one of a portion of the fitting portion on a side of the terminal holding wall relative to the regulating surface and another portion of the fitting portion on an opposite side of the terminal holding wall relative to the regulating surface.

* * * * *